United States Patent
Minagawa

(10) Patent No.: US 9,476,916 B2
(45) Date of Patent: Oct. 25, 2016

(54) OVERCURRENT DETECTION APPARATUS AND INTELLIGENT POWER MODULE USING SAME

(71) Applicant: FUJI ELECTRIC CO., LTD., Kawasaki-shi (JP)

(72) Inventor: Kei Minagawa, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 252 days.

(21) Appl. No.: 14/478,568

(22) Filed: Sep. 5, 2014

(65) Prior Publication Data
US 2014/0375333 A1    Dec. 25, 2014

Related U.S. Application Data

(63) Continuation of application No. PCT/JP2013/002262, filed on Apr. 1, 2013.

(30) Foreign Application Priority Data

Jun. 22, 2012  (JP) .................................. 2012-140931

(51) Int. Cl.
G01R 17/02 (2006.01)
H02M 1/08 (2006.01)
(Continued)

(52) U.S. Cl.
CPC ........... *G01R 17/02* (2013.01); *G01R 19/0092* (2013.01); *H02M 1/08* (2013.01);
(Continued)

(58) Field of Classification Search
CPC .............. G01R 17/02; G01R 19/0092; H03K 17/0828
USPC ................................ 324/537; 361/93.1, 93.7
See application file for complete search history.

(56) References Cited

U.S. PATENT DOCUMENTS 5,375,029 A    12/1994  Fukunaga et al.
5,710,508 A    1/1998   Watanabe
(Continued)

FOREIGN PATENT DOCUMENTS

| EP | 1191692 A1 | 3/2002 |
| JP | 06-120787 A | 4/1994 |
| JP | 08-316808 A | 11/1996 |
| JP | 2002-051456 A | 2/2002 |
| JP | 2004-312924 A | 11/2004 |
| WO | 01/63765 A1 | 8/2001 |

OTHER PUBLICATIONS

International Search Report dated Jul. 2, 2013, issued in PCT/JP2013/002262, English translation provided.

*Primary Examiner* — Christ Mahoney
(74) *Attorney, Agent, or Firm* — Rossi, Kimms & McDowell LLP

(57) ABSTRACT

An overcurrent detection apparatus includes a sense emitter current detection unit that detects a sense emitter current output from a sense emitter of an IGBT as a sense emitter voltage, and a comparison unit that detects an overcurrent by comparing the sense emitter voltage detected by the sense emitter current detection unit with a threshold voltage. The overcurrent detection apparatus also includes a correction current detection unit that detects a correction current corresponding to a current flowing between a gate and the sense emitter of the IGBT as a corrected voltage; and a voltage correction unit that calculates a sense emitter corrected voltage by subtracting the correction voltage detected by the corrected current detection unit from the sense emitter voltage detected by the sense emitter current detection unit, and supplies the sense emitter corrected voltage to the comparison unit.

15 Claims, 6 Drawing Sheets

(51) Int. Cl.
  *H02M 1/32*     (2007.01)
  *H03K 17/082*   (2006.01)
  *G01R 19/00*    (2006.01)
  *H02M 1/00*     (2006.01)
  *G01R 19/165*   (2006.01)

(52) U.S. Cl.
  CPC .......... *H02M 1/32* (2013.01); *H03K 17/0828* (2013.01); *G01R 19/16547* (2013.01); *H02M 2001/0009* (2013.01); *H03K 2217/0027* (2013.01)

(56) References Cited

U.S. PATENT DOCUMENTS

| | | |
|---|---|---|
| 2001/0026429 A1 | 10/2001 | Fukuda et al. |
| 2002/0141126 A1* | 10/2002 | Tabata ............... H03K 17/0828 361/93.7 |
| 2004/0201935 A1 | 10/2004 | Yamamoto |
| 2014/0192449 A1* | 7/2014 | Shimizu ............ H03K 17/0828 361/93.1 |

\* cited by examiner (Background Art)

OVERCURRENT DETECTION APPARATUS AND INTELLIGENT POWER MODULE USING SAME

CROSS-REFERENCE TO RELATED APPLICATIONS

This application is a continuation of International Application No. PCT/JP2013/002262, filed on Apr. 1, 2013, and is based on and claims priority to Japanese Patent Application No. JP 2012-140931, filed on Jun. 22, 2012. The disclosure of the Japanese priority application and the PCT application in their entirety, including the drawings, claims, and the specification thereof, are incorporated herein by reference.

BACKGROUND

1. Field of the Invention

Embodiments of the present invention relate to an overcurrent detection apparatus that protects an insulated gate bipolar transistor ("IGBT") from breakage when an overcurrent flows through the IGBT, and also relates an intelligent power module using the same.

2. Discussion of the Background

A three-phase inverter circuit constituting a power conversion apparatus is configured by connecting series circuits, in which two each of six IGBTs and six freewheeling diodes ("FWD") connected to the IGBTs in anti-parallel are connected in series, in parallel to a direct current power supply, and an inductance load such as an electric motor is connected to connection points between the IGBTs of the respective series circuits.

The IGBT used in this type of power conversion apparatus is provided with an overcurrent protection circuit that protects the IGBT from breakage when an overcurrent flows through the IGBT.

FIG. 5 shows a configuration of such a conventional overcurrent protection circuit. An IGBT 100 is provided with a collector 100c, an emitter 100e, and a sense emitter 100se. The sense emitter 100se outputs a sense current that is approximately several thousand times or several tens of thousands of times smaller than a current flowing between the collector 100c and the emitter 100e. In the overcurrent protection circuit, a current detection resistor 101 is interposed between the sense emitter 100se and the ground, and a high potential side sense voltage Vse of the current detection resistor 101 is input into a non-inverting input terminal of an overcurrent detection comparator 102.

A threshold voltage Vth for determining an overcurrent is input into an inverting input terminal of the overcurrent detection comparator 102, and when the sense voltage Vse is equal to or larger than the threshold voltage Vth, an overcurrent detection signal Soc inverted from an OFF condition to an ON condition is output from the overcurrent detection comparator 102.

The overcurrent detection signal Soc is supplied to a low pass filter circuit 103 and integrated at a predetermined time constant in order to prevent erroneous detection of an overcurrent in a transient increasing condition in which the sense voltage Vse generated when the IGBT 100 is turned ON takes a value exceeding the threshold voltage Vth.

Note that the IGBT 100 is drive-controlled by a gate current supplied from a gate drive circuit 105. The gate drive circuit 105 includes a P-channel MOSFET 108 and an N-channel MOSFET 109 that are connected in series between a control power supply 106 and a ground 107, and a connection point between the P-channel MOSFET 108 and the N-channel MOSFET 109 is connected to a gate 100g of the IGBT 100. The P-channel MOSFET 108 and the N-channel MOSFET 109 are controlled by a driver IC 110 having a protective function such that when one thereof is in an ON condition, the other is in an OFF condition.

An operation of the overcurrent protection circuit described above will now be described using a signal waveform diagram shown in FIGS. 6A, 68, 6C, and 6D.

When the P-channel MOSFET 108 of the IGBT drive circuit is switched ON, a control voltage Vgcc that is equal to a voltage Vcc (approximately 15 V, for example) of the control power supply 106 is applied to the gate 100g of the IGBT 100.

The IGBT 100 is an insulated gate type semiconductor device, or a so-called voltage driven device, and a gate current Ig flows through the gate 100g of the IGBT 100 in order to charge a gate capacitance (here indicating a gate-emitter capacitance). When the gate capacitance is charged, a gate voltage Vg rises, as shown in FIG. 6B. When the gate voltage Vg rises so as to reach a gate threshold voltage, a collector current Ic rises, as shown in FIG. 6A, whereupon a collector-emitter voltage Vce starts to decrease, as shown in FIG. 6A.

Further, a sense current Ise that is approximately several thousand times to several tens of thousands of times smaller than the collector current Ic rises, as shown in FIG. 6 and voltages at respective ends of a sense resistor Rs through which the sense current Ise flows, or in other words a sense voltage Vse, also increases, as shown in FIG. 6D. When the gate voltage Vg reaches the gate threshold voltage, the collector-emitter voltage Vce decreases, leading to an increase in a mirror capacitance (a gate-collector capacitance) of the IGBT 100, and as a result, the gate voltage Vg shifts to a substantially constant region.

Meanwhile, the sense current Ise also increases, as shown in FIG. 6C, leading to an increase in the sense voltage Vse, as shown in FIG. 6D, and when the sense voltage Vse reaches an overcurrent threshold voltage Vth (which is determined by a reference voltage E) at which an overcurrent is determined, an output of the overcurrent detection comparator 102 outputs an H level overcurrent detection signal Soc.

The overcurrent detection signal Soc is supplied to the low pass filter circuit 103, and therefore an output of the low pass filter circuit 103 increases gently. At this time, the time constant of the low pass filter circuit 103 is set to be larger than a misdetection prevention period T1 extending from a point at which the sense voltage Vse exceeds the overcurrent threshold voltage Vth to a point at which the sense voltage Vse falls to or below the overcurrent threshold voltage Vth.

Hence, during the misdetection prevention period T1 in which the sense voltage Vse exceeds the overcurrent threshold voltage Vth, the filter output of the low pass filter circuit 103 does not reach the H level of the overcurrent detection comparator 102.

When the filter output of the low pass filter circuit 103 is supplied to the driver IC having a protective function, therefore, the filter output does not reach the H level of the overcurrent detection comparator 102. As a result, the gate current Ig is not blocked by the driver IC 110 having a protective function.

However, when the H level of the overcurrent detection signal Soc output from the overcurrent detection comparator 102 is maintained beyond the misdetection prevention period T1, the filter output of the low pass filter circuit 103 reaches the H level. As a result, output of the gate current Ig to the gate 100g of the IGBT 100 is stopped by the driver IC 110 having a protective function, whereby the overcurrent protection function of the IGBT 100 is activated.

In the above configuration shown in FIG. 5, a case in which erroneous overcurrent detection when the IGBT 100 is turned ON is prevented using the low pass filter circuit 103 was described, but a configuration such as that described in Japanese Patent Application Publication No. H6-120787 ("Patent Document 1") may be employed instead.

In Patent Document 1, the low pass filter circuit is omitted, and a timer is activated upon detection of a rising edge of an input signal for activating the IGBT. As a result, a higher reference voltage than a normal reference voltage is supplied to the overcurrent detection comparator during the aforesaid misdetection prevention period T1, whereby the overcurrent detection signal that is output from the overcurrent detection comparator within the period in which the sense voltage Vse exceeds the overcurrent threshold voltage Vth is maintained at an L level.

Incidentally, according to the conventional examples described above, either the rise of the H level overcurrent detection signal Soc output from the overcurrent detection comparator 102 is smoothed using the low pass filter circuit, or a higher reference voltage than the normal reference voltage is applied to the overcurrent detection comparator during the misdetection prevention period T1 using the timer. In so doing, an erroneous detection is prevented from occurring during the period in which the sense voltage Vse generated when the IGBT is turned ON exceeds the overcurrent threshold voltage Vth.

In the conventional examples described above, however, when the low pass filter circuit is used, the misdetection prevention period T1 of the IGBT is, at 4 to 5 μsec, comparatively long, and the overcurrent determination is performed after the misdetection prevention period T1 has elapsed. Hence, a problem remains unsolved in that when an overcurrent condition occurs, a determination time required to determine the overcurrent condition lengthens. Moreover, the misdetection prevention period T1 differs according to the IGBT, and therefore the time constant of the low pass filter circuit must be set to be relatively long. Likewise in this respect, a problem remains unsolved in that the determination time required to determine an overcurrent condition lengthens. As a result, simultaneous detection of a short circuit current, which requires that the determination be performed quickly, is impossible.

Meanwhile, when the reference voltage of the overcurrent detection comparator is modified using the timer, as in the invention described in Patent Document 1, a low pass filter is not used, and therefore the need to set a time constant is eliminated. In the invention described in Patent Document 1, however, it is necessary to set a comparatively long time up period corresponding to the misdetection prevention period T1 on the timer. Since the misdetection prevention period T1 differs according to the IGBT, a problem remains unsolved in that the time up period must be set to be relatively long. Furthermore, in the invention described in Patent Document 1, the timer, a switch circuit, two types of reference voltage sources, and so on must be provided, and therefore a problem remains unsolved in that the circuit configuration increases in size.

SUMMARY

Embodiments of the present invention provide an overcurrent detection apparatus in which a misdetection prevention period can be shortened, and an intelligent power module using the overcurrent detection apparatus.

A first aspect of the present invention is an overcurrent detection apparatus having a sense emitter current detection unit that detects a sense emitter current output from a sense emitter of an insulated gate bipolar transistor as a sense emitter voltage, and a comparison unit that detects an overcurrent by comparing the sense emitter voltage detected by the sense emitter current detection unit with a threshold voltage. The overcurrent detection apparatus includes a correction current detection unit that detects a correction current corresponding to a current flowing between a gate and the sense emitter of the insulated gate bipolar transistor as a corrected voltage; and a voltage correction unit that calculates a sense emitter corrected voltage by subtracting the correction voltage detected by the corrected current detection unit from the sense emitter voltage detected by the sense emitter current detection unit, and supplies the sense emitter corrected voltage to the comparison unit.

In a second aspect of the overcurrent detection apparatus according to the present invention, the sense current detection unit and the corrected current detection unit are configured to include a current detection resistor so as to detect a current as a voltage value.

In a third aspect of the overcurrent detection apparatus according to the present invention, the correction current detection unit is constituted by a current mirror circuit inserted into a current path for supplying a current to the gate, and the current detection resistor, which is interposed between a current output unit of the current mirror circuit and a ground.

In a fourth aspect of the overcurrent detection apparatus according to the present invention, the correction current detection unit is constituted by a second semiconductor current control element that is disposed parallel to a first semiconductor current control element for controlling a gate current of the insulated gate bipolar transistor and has a smaller cell size than the first semiconductor current control element, and the current detection resistor, which is interposed between an output side of the second semiconductor control element and a ground.

Further, in a first aspect of an intelligent power module according to the present invention, an insulated gate bipolar transistor and a freewheeling diode connected in ant-parallel to the insulated gate bipolar transistor, the overcurrent detection apparatus according to any one of the first to fourth aspects described above, and a driver IC that drives the insulated gate bipolar transistor and at least protects the insulated gate bipolar transistor on the basis of an overcurrent detection value of the overcurrent detection apparatus are gathered into a single package.

According to the present invention, the sense emitter corrected voltage calculated by subtracting the correction voltage, which is detected by the corrected current detection unit and corresponds to the current flowing between the gate and the sense emitter of the IGBT, from the sense emitter voltage of the IGBT, which is detected by the sense emitter current detection unit, is compared with an overcurrent threshold voltage. Hence, an overcurrent determination is performed using a net sense emitter voltage corresponding to the collector current of the IGBT, and therefore a misdetection prevention period occurring when the IGBT is turned ON can be shortened. As a result, the present invention can be applied not only to overcurrent detection, but also short circuit current detection.

Furthermore, the intelligent power module is configured by gathering the overcurrent detection apparatus described above, an IGBT, an FWD, and an IGBT driver IC into a single package, and therefore an overall configuration can be reduced in size

DETAILED DESCRIPTION OF ILLUSTRATED EMBODIMENTS

Embodiments of the present invention will be described below with reference to the drawings.

Figure 1:
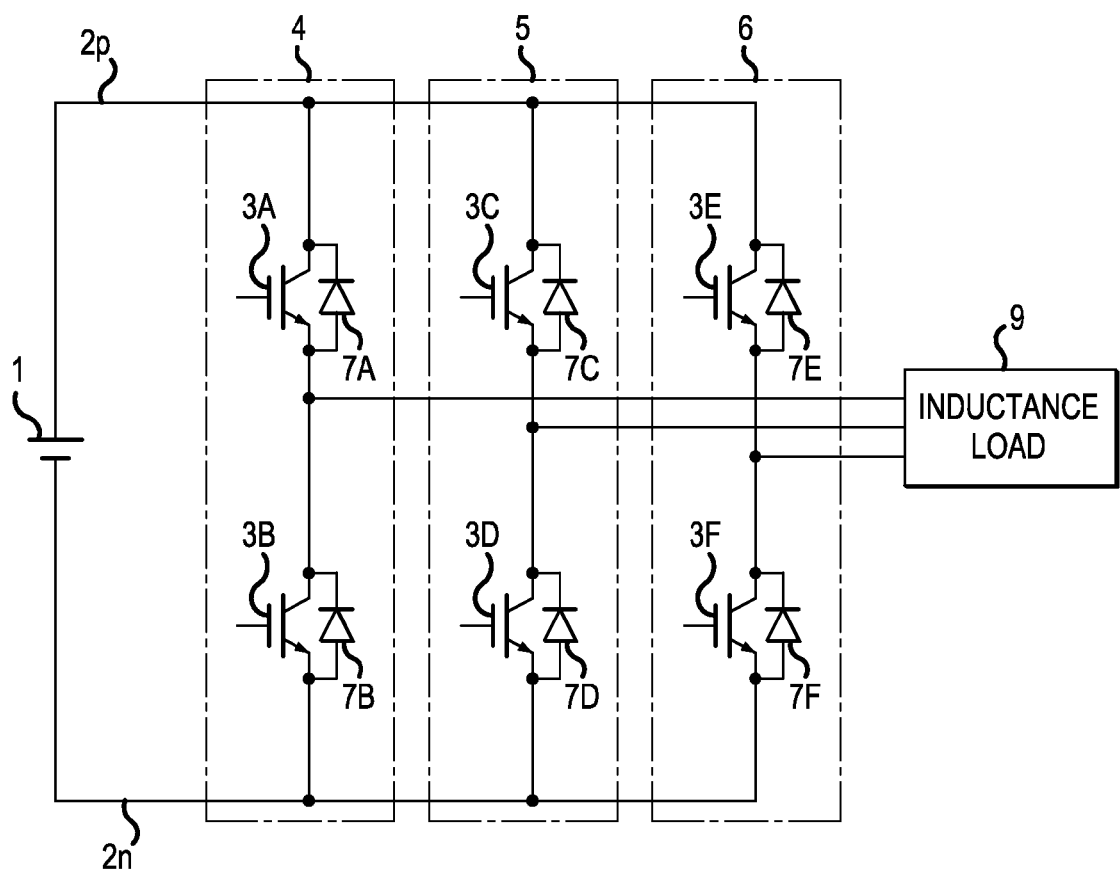
FIG. 1 is a circuit diagram showing a power conversion apparatus to which the present invention may be applied.
Figure 2:
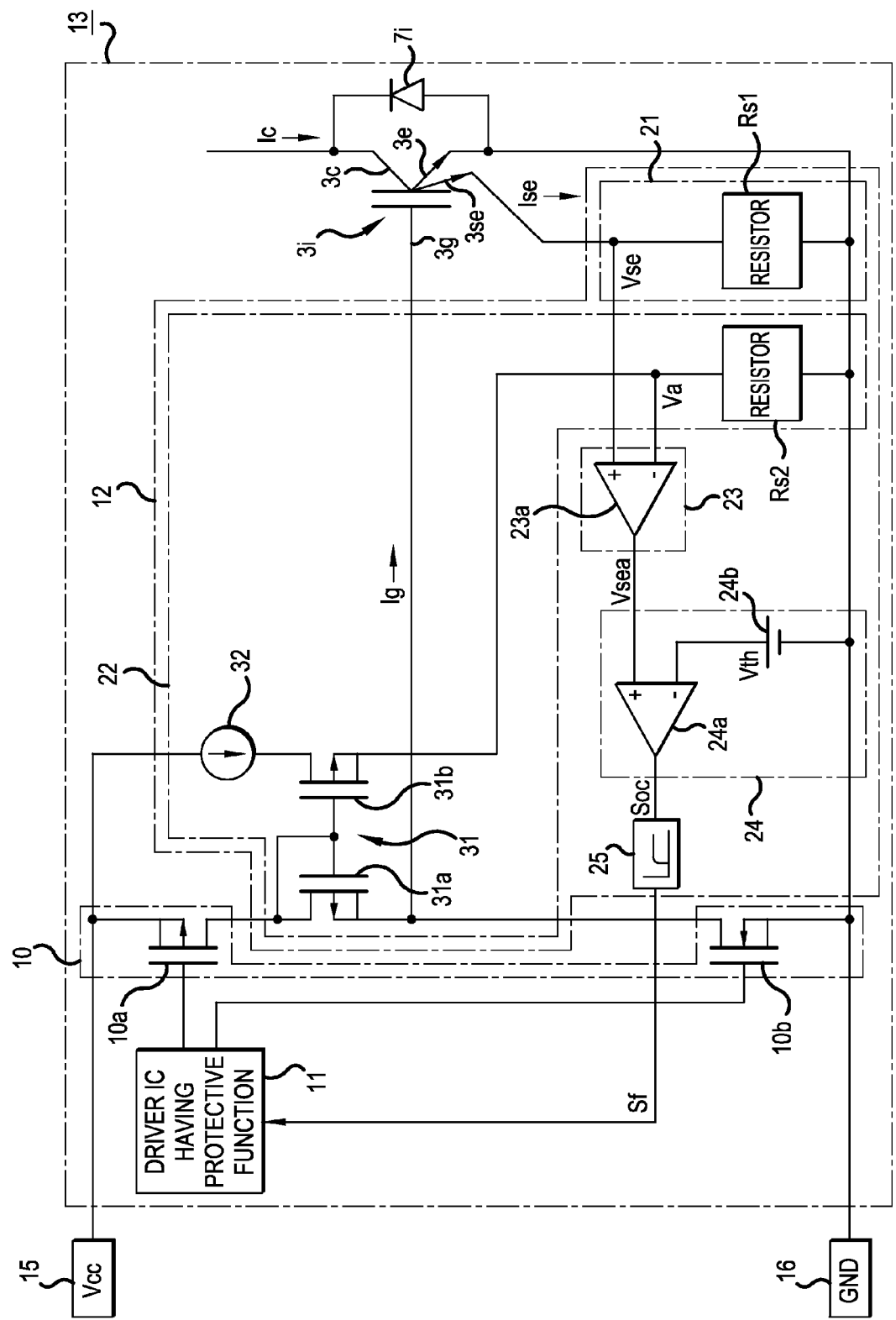
FIG. 2 is a circuit diagram showing an intelligent power module including an overcurrent detection apparatus according to the present invention.

FIG. 1 is a circuit diagram showing a power conversion apparatus to which the present invention may be applied, and FIG. 2 is a circuit diagram showing an intelligent power module including an overcurrent detection apparatus according to a first embodiment of the present invention.

As shown in FIG. 1, the power conversion apparatus to which the present invention may be applied is constituted by an inverter circuit that converts direct current power into three-phase alternating current power, for example. The inverter circuit includes a positive electrode side line 2p connected to a positive electrode side of a main direct current power supply 1, and a negative electrode side line 2n connected to a negative electrode side of the main direct current power supply 1.

A series circuit 4 in which insulated gate bipolar transistors ("IGBT") 3A and 3B are connected in series, a series circuit 5 in which IGBTs 3C and 3D are connected in series, and a series circuit 6 in which IGBTs 3E and 3F are connected in series are connected in parallel between the positive electrode side line 2p and the negative electrode side line 2n. Freewheeling diodes ("FWD") 7A to 7F are connected in anti-parallel to the respective IGBTs 3A to 3F.

A connection point between the IGBTs 3A and 3B of the series circuit 4, a connection point between the IGBTs 3C and 3D of the series circuit 5, and a connection point between the IGBTs 3E and 3F of the series circuit 6 are connected to an inductance load 9 such as an electric motor.

An operation of the inverter circuit will now be described with reference to a signal waveform diagram shown in FIGS. 3A, 3B, 3C, 3D, 3E, and 3F.

It is assumed that, at a certain timing, the IGBT 3A and the IGBT 3D are switched ON such that a current I1 is supplied to the load 9 from the main direct current power supply 1. Next, when the IGBT 3A and the IGBT 3D are switched OFF, the current I1 flowing through the load 9 passes through the FWDs 7B, 7C and flows into the main direct current power supply 1 as a reflux current. Hence, by switching the IGBTs 3A to 3F ON and OFF in sequence, three-phase power is supplied to the load 9.

Figure 3:
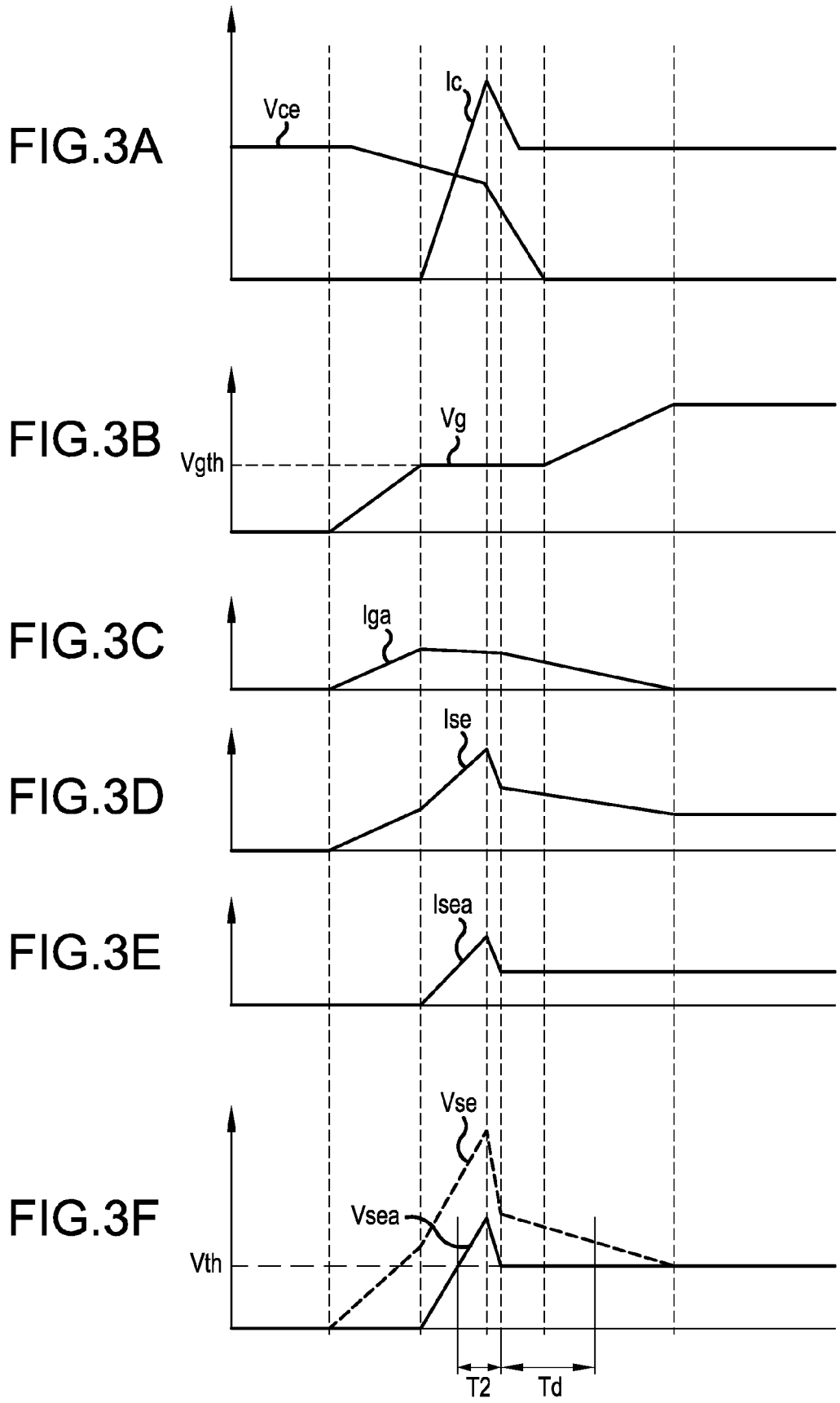
FIGS. 3A, 3B, 3C, 3D, 3E, and 3F are signal waveform diagrams illustrating an operation of the overcurrent detection apparatus shown in FIG. 2.

Incidentally, when the IGBT 3D is switched ON in a condition where the IGBT 3A is in transit from ON to OFF such that a current I2 flows through the FWD 7C, an arm short circuit occurs momentarily in the series circuit including the FWD 7C and the IGBT 3D. The arm short circuit is canceled when reverse recovery occurs in the FWD 7C, but when the IGBT 3D turns ON, a reverse recovery current of the FWD 7C flows while superimposed on a collector current of the IGBT 3D. As shown in FIG. 3A, therefore, during a turn ON operation of the IGBT 3D, a reverse recovery current Ir is superimposed on a collector current Ic of the IGBT 3D, and as a result, the collector current Ic jumps up and then shifts to a steady state.

As shown in FIG. 2, the IGBTs 3$i$ and FWDs 7$i$ (i=A to F) constituting the inverter circuit are respectively packaged together with an IGBT drive circuit 10, a driver IC 11 having a protective function, and an overcurrent detection apparatus 12 to form an intelligent power module 13.

Here, the IGBT drive circuit 10 includes a P-channel MOSFET 10a and an N-channel MOSFET 10b connected in series between a control power supply 15 and a ground 16, and a connection point between the P-channel MOSFET 10a and the N-channel MOSFET 10b is connected to a gate 3g of the IGBT 3$i$.

The driver IC 11 having a protective function controls the P-channel MOSFET 10a and the N-channel MOSFET 10b constituting the IGBT drive circuit 10 such that when one thereof is ON, the other is OFF. To turn the IGBT 3$i$ ON, the driver IC 11 having a protective function switches the P-channel MOSFET 10a ON and switches the N-channel MOSFET 10b OFF. As a result, a gate current Ig is supplied to the gate 3g of the IGBT 3$i$ from the control power supply 15 so as to charge a gate capacitance (here indicating a gate-emitter capacitance). Conversely, to turn the IGBT 3$i$ OFF, the driver IC 11 having a protective function switches the P-channel MOSFET 10a OFF and switches the N-channel MOSFET 10b ON As a result, the gate 3g of the IGBT 3$i$ is connected to the ground 16 such that the gate capacitance is discharged, The overcurrent detection apparatus 12 includes a sense emitter current detection unit 21, a correction current detection unit 22, a voltage correction unit 23, a comparison unit 24, and a low pass filter circuit 25.

The sense emitter current detection unit 21 is constituted by a current detection resistor Rs1 connected between the ground 16 and a sense emitter 3se for outputting a sense emitter current Ise that is approximately several thousand times to several tens of thousands of times smaller than a collector current Ic flowing through a collector 3c formed in the IGBT 3$i$. A sense emitter voltage Vse obtained by converting the sense emitter current Ise into a voltage is output from a high potential side of the current detection resistor Rs1.

The correction current detection unit 22 includes at least a current mirror circuit 31 having an input unit that is connected to a drain side of the P-channel MOSFET 10a of the IGBT drive circuit 10, and a current detection resistor Rs2 connected between an output unit of the current mirror circuit 31 and the ground 16.

The current mirror circuit 31 is constituted by a P-channel MOSFET 31a connected between the drain of the P-channel MOSFET 10a of the IGBT drive circuit 10 and the gate 3g of the IGBT 3$i$, and a P-channel MOSFET 31b having a gate that is connected to a gate of the P-channel MOSFET 31a.

A connection point between the respective gates of the P-channel MOSFETs 31a and 31b is connected to a connection point between respective drains of the P-channel MOSFET 31a and the P-channel MOSFET 10a, Further, a drain of the P-channel MOSFET 31b is connected to the control power supply 15 via a constant current circuit 32, and a source of the P-channel MOSFET 31b is connected to a high potential side of the current detection resistor Rs2.

Here, a current mirror ratio of the current mirror circuit 31 is set so as to obtain a correction gate current Iga, which serves as a current value corresponding to a gate current component superimposed on the sense emitter current Ise output from the sense emitter 3se of the IGBT 3i. The correction gate current Iga corresponding to the gate current component included in the sense emitter current Ise output from the source of the P-channel MOSFET 31b of the current mirror circuit 31 is supplied to the current detection resistor Rs2.

Hence, a correction voltage Va obtained by converting the correction gate current Iga into a voltage is output from the high potential side of the current detection resistor Rs2.

The voltage correction unit 23 is constituted by an operational amplifier 23a that performs differential amplification. The sense emitter voltage Vse obtained from the high potential side of the current detection resistor Rs1 of the sense emitter current detection unit 21 is applied to a non-inverting input terminal of the operational amplifier 23a, and the correction voltage Va obtained from the high potential side of the current detection resistor Rs2 of the correction current detection unit 22 is applied to an inverting input terminal. As a result, a sense emitter corrected voltage Vsea obtained by subtracting the correction voltage Va from the sense emitter voltage Vse is output from the operational amplifier 23a.

The comparison unit 24 is constituted by an overcurrent detection comparator 24a. The sense emitter corrected voltage Vsea output from the voltage correction unit 23 described above is applied to a non-inverting input terminal of the overcurrent detection comparator 24a, and a reference power supply 24b that outputs an overcurrent threshold voltage Vth is connected to an inverting input terminal. When the sense emitter corrected voltage Vsea is equal to or higher than the overcurrent threshold voltage Vth, an overcurrent detection signal Soc inverted from an L level to an H level is output from the overcurrent detection comparator 24a.

The overcurrent detection signal Soc output from the comparison unit 24 is supplied to the low pass filter circuit 25, whereupon a filter output Sf subjected to low pass filter processing in the low pass filter circuit 25 is supplied to the driver IC 11 having a protective function.

In the driver IC 11 having a protective function, the filter output Sf input from the low pass filter circuit 25 is compared with the reference voltage Vref, and when Sf>Vref, an overcurrent condition is determined, whereupon a gate signal applied to the gate of the P-channel MOSFET 10a of the IGBT drive circuit 10 is switched OFF and a gate signal applied to the gate of the N-channel MOSFET 10b is switched ON, with the result that driving of the IGBT 3i is stopped.

Next, an operation of the first embodiment described above will be described with reference to the signal waveform diagrams shown in FIGS. 3A, 3B, 3C, 3D, 3E, and 3F.

When the P-channel MOSFET 10a of the IGBT drive circuit 10 is switched ON, a control voltage Vgcc that is equal to a voltage Vcc (approximately 15 V, for example) of the control power supply 15 is applied to the gate 3g of the IGBT 3i.

The gate current Ig flows through the gate 3g of the IGBT 31 such that the gate capacitance (here indicating the gate-emitter capacitance) is charged. When the gate capacitance is charged, the gate voltage Vg rises, as shown in FIG. 3B.

At this time, the correction gate current Iga, which is proportionate to the gate current Ig and corresponds to the sense emitter current Ise, starts to be output from the P-channel MOSFET 31b of the current mirror circuit 31, as shown in FIG. 3C.

When the gate voltage Vg rises so as to reach a gate threshold voltage Vgth, the collector current Ic rises, as shown in FIG. 3A, and a collector-emitter voltage Vce starts to fall, as shown in FIG. 3A.

Further, the sense emitter current Ise that is approximately several thousand times to several tens of thousands of times smaller than the collector current Ic rises, as shown in FIG. 3D, and voltages at respective ends of the current detection resistor Rs1 through which the sense emitter current Ise flows, or in other words the sense emitter voltage Vse, also increases, as shown by a dotted line in FIG. 3F. At this time, in the sense emitter current Ise, as shown in FIG. 3D, a gate current component that is proportionate to the gate current Ig, which flows until the gate capacitance is charged, is superimposed on a collector current component that is approximately several thousand times to several tens of thousands of times smaller than the original collector current Ic.

When the gate voltage Vg subsequently reaches the gate threshold voltage Vgth, the collector-emitter voltage Vce decreases such that a mirror capacitance (a gate-collector capacitance) of the IGBT 100 increases, and as a result, the gate voltage Vg shifts to a substantially constant region. Meanwhile, the sense emitter current Ise also increases, as shown in FIG. 3D, and accordingly, the sense emitter voltage Vse increases along a dotted line shown in FIG. 3F.

Further, the correction gate current Iga increases, as shown in FIG. 3C, and when the gate voltage Vg reaches a gate threshold voltage Vgth, the correction gate current Iga starts to decrease gently.

As a result, as shown in FIG. 3E, an amplitude of a corrected sense emitter current Isea obtained by subtracting the correction gate current Iga from the sense emitter current Ise is suppressed in comparison with that of the sense emitter current Ise.

In this embodiment, the sense emitter current detection unit 21 detects the sense emitter current Ise as the sense emitter voltage Vse, whereupon the sense emitter voltage Vse is applied to the non-inverting input terminal of the operational amplifier 23a constituting the voltage correction unit 23, Meanwhile, the correction current detection unit 22 detects the correction gate current Iga as the correction voltage Va, whereupon the correction voltage Va is applied to the inverting input terminal of the operational amplifier 23a constituting the voltage correction unit 23.

Hence, the operational amplifier 23a subtracts the correction voltage Va from the sense emitter voltage Vse n order to output the sense emitter correction voltage Vsea. As shown by a solid line in FIG. 3F, by excluding the correction voltage Va from the sense emitter voltage Vse, the gate current component is removed from the sense emitter correction voltage Vsea, with the result that the amplitude of the sense emitter correction voltage Vsea, generated by the collector current component alone, is suppressed.

As shown by a dotted line in FIG. 3F, the sense emitter correction voltage Vsea has a much smaller amplitude than a sense emitter voltage Vse according to the conventional example described above, and therefore a misdetection prevention period T2 in which the overcurrent threshold voltage Vth is exceeded when the IGBT 3i turns ON can be reduced to approximately 1 μsec. As a result, the misdetection prevention period T2 can be reduced to between one quarter and one fifth the length of the misdetection prevention period T1 according to the conventional example.

Accordingly, a time constant of the low pass filter circuit 25 connected to the output side of the overcurrent detection comparator 24a can be reduced to between one quarter and one fifth of the time constant of the low pass filter circuit 103 according to the conventional example described above.

Therefore, an erroneous detection in an overcurrent condition occurring when the IGBT 3i is turned ON can be prevented, and in a case where an overcurrent condition is determined in a normal switching condition when the IGBT 3i is not turned ON, a determination period including the misdetection prevention period 12 and a detection period Td actually required to detect the overcurrent condition can be shortened sufficiently, enabling highly precise overcurrent detection. Moreover, the timer described in Patent Document 1 is not required, and therefore the overcurrent detection apparatus 12 can be reduced in size According to this embodiment, therefore, the overcurrent determination period can be shortened, and as a result, when a short circuit current flows through the IGBT, the short circuit current can be detected immediately. Hence, a short circuit can be detected without providing a separate short circuit current detection circuit, with the result that a circuit configuration of the IGBT protection circuit can be simplified and reduced in size.

Furthermore, by applying the current mirror circuit 31 that detects the gate current Ig of the IGBT 3i to the correction current detection unit 22, the current mirror ratio can be adjusted. As a result, the correction gate current Iga corresponding to the sense emitter current output from the sense emitter 3se of the IGBT 3i can be detected accurately.

Further, currents are detected by the sense emitter current detection unit 21 and the correction current detection unit 22 as voltage values using the current detection resistors Rs1 and Rs2. Therefore, by adjusting at least one of respective resistance values of the current detection resistors Rs1 and Rs2, the respective voltage values of the sense emitter voltage Vse and the correction gate voltage Vga can be adjusted to appropriate values. As a result, an overcurrent can be detected more accurately.

Furthermore the IGBT 3i, the FWD 7i, the IGBT drive circuit 10, the driver IC 11 having a protective function, and the overcurrent detection apparatus 12 are gathered into a single package constituting the intelligent power module 13, and therefore the intelligent power module 13 can be further reduced in size.

Figure 4:
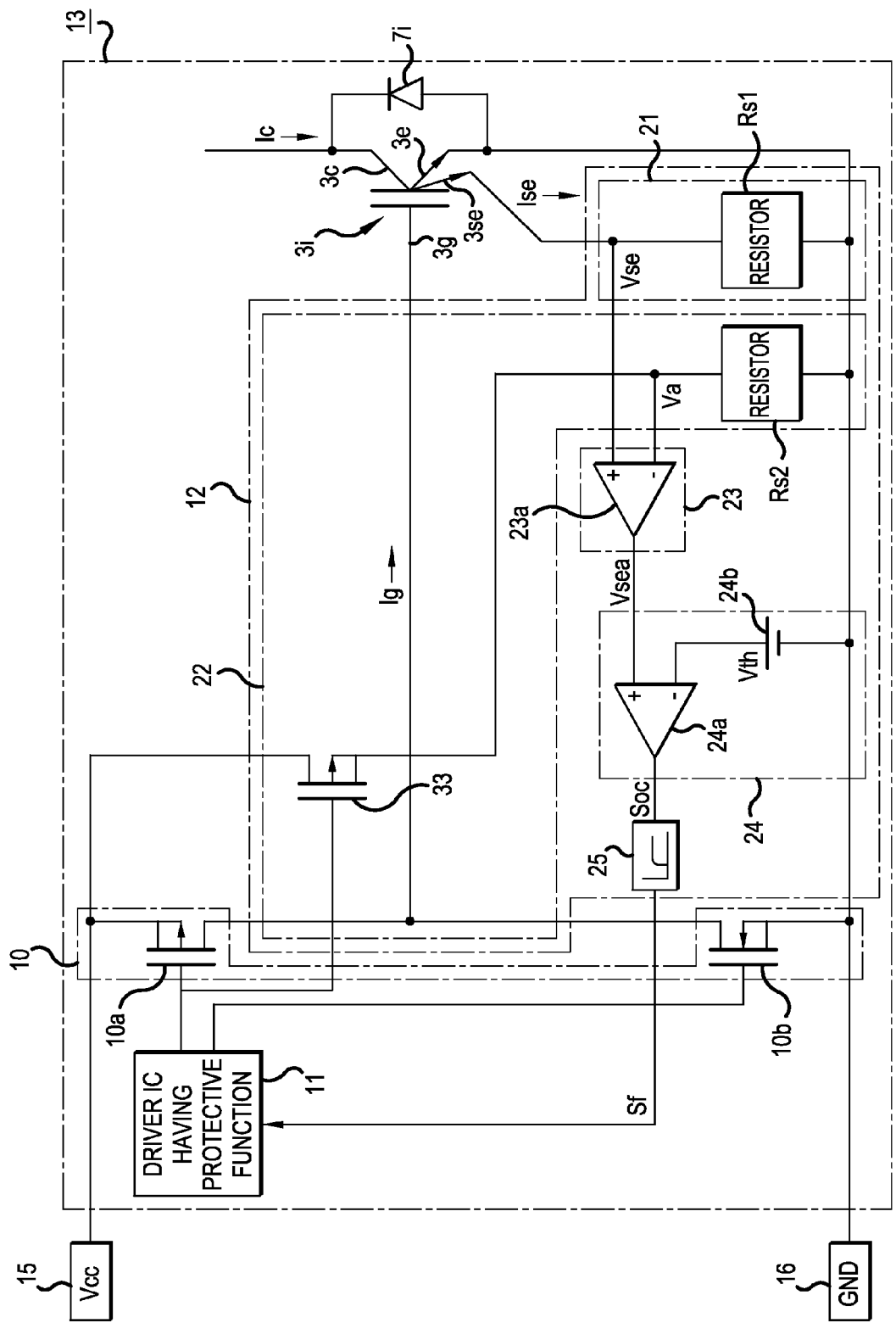
FIG. 4 is a circuit diagram corresponding to FIG. 2 and showing a second embodiment of the present invention.
Figure 5:
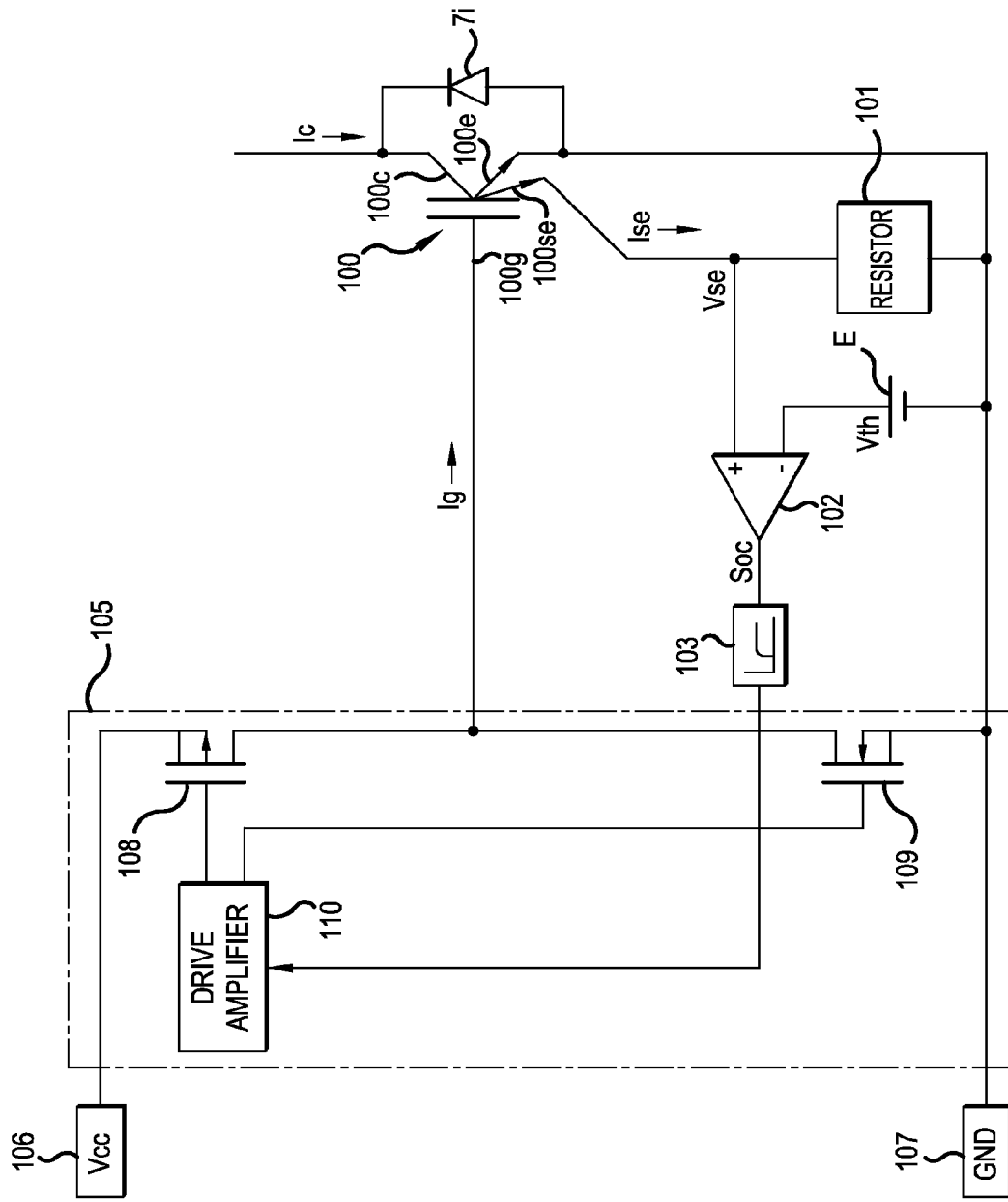
FIG. 5 is a circuit diagram showing a conventional overcurrent detection apparatus for an IGBT.
Figure 6A:
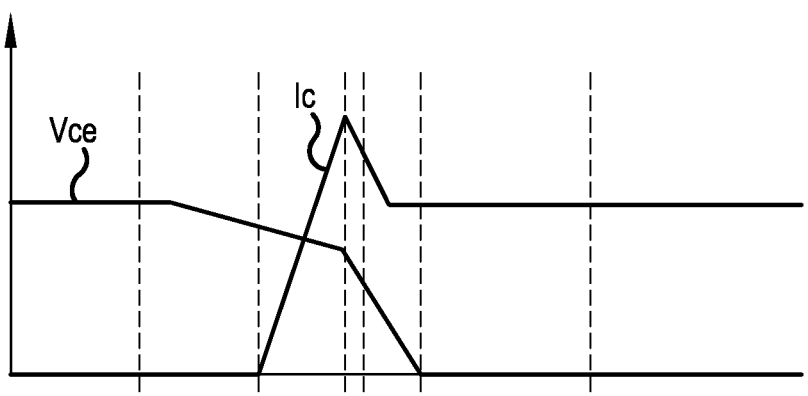
FIGS. 6A, 6B, 6C, and 6D are signal waveform diagrams illustrating an operation of FIG. 5.
Figure 6B:
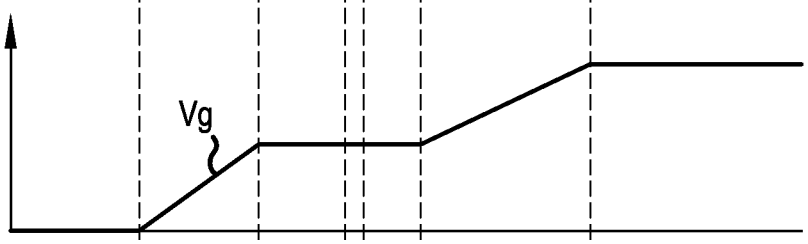
Figure 6C:
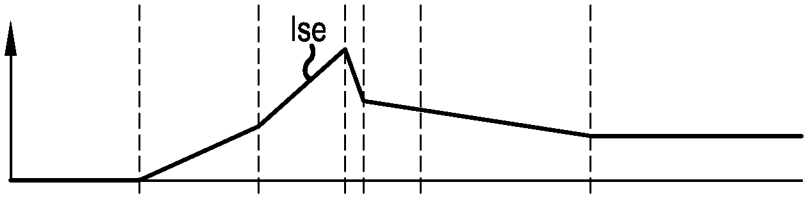
Figure 6D:
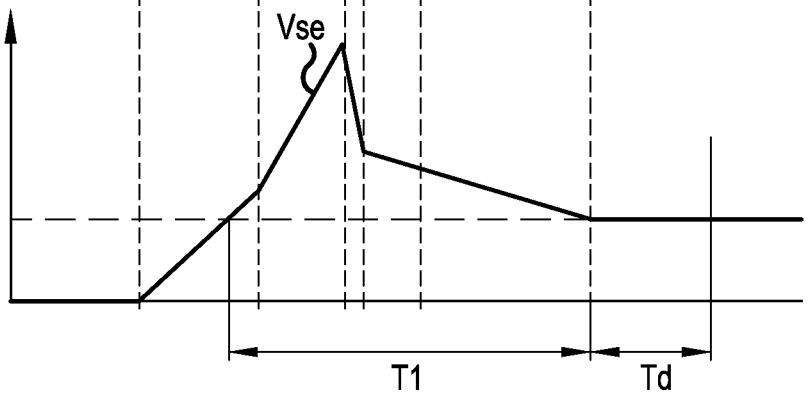

Next, a second embodiment of the present invention will be described with reference to a circuit diagram shown in FIG. 4.

In the second embodiment, the configuration of the correction current detection unit 22 is modified. More specifically, in the second embodiment, as shown in FIG. 4, the current mirror circuit 31 and the constant current circuit 32 are omitted from the correction current detection unit 22, and instead, a P-channel MOSFET 33 driven by a gate control signal of a driver IC 11 having a protective function is provided. A drain of the P-channel MOSFET 33 is connected to the control power supply 15, and a source is connected to the high potential side of the current detection resistor Rs2.

Here, the P-channel MOSFET 33 is set at a smaller cell size than the P-MOSFET 10a of the IGBT drive circuit 10. In this case, a cell size ratio between the P-channel MOSFETs 10a and 33 is set to be equal to the current mirror ratio of the current mirror circuit 31 described above and a correction gate current Iga output from the P-channel MOSFET 33 is set at a value that corresponds to the sense emitter current Ise, output from the sense emitter 3se of the IGBT 3i.

Likewise in the second embodiment, a similar correction gate current Iga to that of the P-channel MOSFET 31b of the current mirror circuit 31 is output from the P-channel MOSFET 33, and the correction gate current Iga is supplied to the current detection resistor Rs2. As a result, a correction voltage Va corresponding to the correction gate current Iga is obtained from the high potential side of the current detection resistor Rs2.

Similarly to the first embodiment described above, therefore, the corrected sense emitter voltage Vsea is calculated by the voltage correction unit 23 by subtracting the correction voltage Va from the sense emitter voltage Vse, and then output to the comparison unit 24 As a result, similar actions and effects to the first embodiment can be obtained.

Moreover, in the second embodiment, the correction current detection unit 22 can be configured simply by providing the P-channel MOSFET 33, which has a different size ratio to the P-channel MOSFET 10a of the IGBT drive circuit 10, and the current detection resistor Rs2, and therefore the correction current detection unit 22 can be reduced in size.

Note that in the embodiments described above, cases in which the low pass filter circuit 25 is provided on the output side of the overcurrent detection comparison unit 24 were described, but the present invention is not limited thereto, and the low pass filter circuit 25 may be provided on the output side of the voltage correction unit 23 such that the filter output of the low pass filter circuit 25 is supplied to the overcurrent detection comparator 24a.

According to embodiments of the present invention, a corrected sense emitter voltage is calculated by subtracting a correction voltage corresponding to a current flowing between a gate and a sense emitter of an IGBT from a sense emitter voltage corresponding to a sense emitter current of the IGBT. in so doing, it is possible to provide an overcurrent detection apparatus in which an overcurrent misdetection prevention period during a turn ON operation of the IGBT can be shortened, and an intelligent power module that uses the overcurrent detection apparatus.

The invention claimed is:

1. An apparatus, comprising.
   a sense emitter current detection unit configured to detect a sense emitter current output from a sense emitter of an insulated gate bipolar transistor as a sense emitter voltage;
   a correction current detection unit configured to detect a correction current corresponding to a current that flows between a gate and the sense emitter of the insulated gate bipolar transistor as a corrected voltage;
   a voltage correction unit configured to calculate a sense emitter corrected voltage by subtracting the corrected voltage from the sense emitter voltage; and
   a comparison unit configured to detect an overcurrent by comparing the sense emitter corrected voltage with a reference voltage.

2. The apparatus according to claim 1, wherein the sense emitter current detection unit and the correction current detection unit each comprise a current detection resistor so as to detect a current as a voltage value.

3. The apparatus according to claim 2, wherein the correction current detection unit comprises a current mirror circuit disposed in a current path that supplies a current to the gate, and the current detection resistor of the correction current detection unit is disposed between a current output unit of the current mirror circuit and a ground.

4. The apparatus according to claim 3, further comprising:
a freewheeling diode connected in anti-parallel to the insulated gate bipolar transistor: and
a driver integrated circuit configured to drive the insulated gate bipolar transistor,
wherein the correction current detection unit, the voltage correction unit, the freewheeling diode, and the driver integrated circuit are formed in a single package.

5. The apparatus according to claim 2, wherein the correction current detection unit comprises a second semiconductor current control element disposed parallel to a first semiconductor current control element configured to control a gate current of the insulated gate bipolar transistor and having a smaller cell size than the first semiconductor current control element, and the current detection resistor of the correction current detection unit is disposed between an output side of the second semiconductor control element and a ground.

6. The apparatus according to claim 5, further comprising:
a freewheeling diode connected in anti-parallel to the insulated gate bipolar transistor: and
a driver integrated circuit configured to drive the insulated gate bipolar transistor,
wherein the correction current detection unit, the voltage correction unit, the freewheeling diode, and the driver integrated circuit are formed in a single package.

7. The apparatus according to claim 2, further comprising:
a freewheeling diode connected in anti-parallel to the insulated gate bipolar transistor; and
a driver integrated circuit configured to drive the insulated gate bipolar transistor,
wherein the correction current detection unit, the voltage correction unit, the freewheeling diode, and the driver integrated circuit are formed in a single package.

8. The apparatus according to claim 1, further comprising:
a freewheeling diode connected in anti-parallel to the insulated gate bipolar transistor: and
a driver integrated circuit configured to drive the insulated gate bipolar transistor,
wherein the correction current detection unit, the voltage correction unit, the freewheeling diode, and the driver integrated circuit are formed in a single package.

9. An apparatus comprising:
an insulated gate bipolar transistor;
a first circuit connected to a sense emitter of the insulated gate bipolar transistor and configured to provide a first voltage;
a second circuit configured to provide a second voltage corresponding to a current that flows between a gate and the sense emitter of the insulated gate bipolar transistor;
a third circuit configured to calculate a corrected voltage using the first voltage and the second voltage; and
a fourth circuit configured to receive the corrected voltage and compare the corrected voltage with a reference voltage.

10. The apparatus according to claim 9, wherein the third circuit is configured to calculate the corrected voltage by subtracting the second voltage from the first voltage.

11. The apparatus according to claim 10, wherein the first and second circuits each comprise a resistor.

12. The apparatus according to claim 11, wherein the second circuit comprises a current mirror circuit disposed in a current path that supplies a current to the gate, and the resistor of the second circuit is disposed between a current output unit of the current mirror circuit and a ground.

13. The apparatus according to claim 11, wherein the second circuit comprises a second semiconductor current control element disposed parallel to a first semiconductor current control element configured to control a gate current of the insulated gate bipolar transistor and having a smaller cell size than the first semiconductor current control element, and the resistor of the second circuit is disposed between an output side of the second semiconductor control element and a ground.

14. The apparatus according to claim 10, further comprising:
a freewheeling diode connected in anti-parallel to the insulated gate bipolar transistor; and
a driver integrated circuit configured to drive the insulated gate bipolar transistor,
wherein the first to fourth circuits, the freewheeling diode, and the driver integrated circuit are formed in a single package.

15. The apparatus according to claim 9, further comprising:
freewheeling diode connected in anti-parallel to the insulated gate bipolar transistor; and
a driver integrated circuit configured to drive the insulated gate bipolar transistor,
wherein the first to fourth circuits, the freewheeling diode, and the driver integrated circuit are formed in a single package.

* * * * *